United States Patent [19]

Kapoor

[11] Patent Number: 5,494,859
[45] Date of Patent: Feb. 27, 1996

[54] LOW DIELECTRIC CONSTANT INSULATION LAYER FOR INTEGRATED CIRCUIT STRUCTURE AND METHOD OF MAKING SAME

[75] Inventor: Ashok K. Kapoor, Palo Alto, Calif.

[73] Assignee: LSI Logic Corporation, Milpitas, Calif.

[21] Appl. No.: 192,076

[22] Filed: Feb. 4, 1994

[51] Int. Cl.$^6$ ................................................ H01L 21/02
[52] U.S. Cl. .................. 437/235; 437/238; 437/240; 437/195; 148/DIG. 81
[58] Field of Search .................... 437/238, 235, 437/919, 195, 978, 240; 148/DIG. 81

[56] References Cited

U.S. PATENT DOCUMENTS 4,028,149   6/1977   Deines et al. .
4,532,700   8/1985   Kinney et al. .
4,968,384   11/1990  Asano .
5,175,130   12/1992  Kondo et al. ............................ 501/39
5,393,712   2/1995   Rostoker et al. ...................... 437/238

*Primary Examiner*—Brian E. Hearn
*Assistant Examiner*—Kevin M. Picardat
*Attorney, Agent, or Firm*—Poms, Smith, Lande & Rose

[57] ABSTRACT

A low dielectric constant insulation layer for an integrated circuit structure material, and a method of making same. The low dielectric constant insulation layer comprises a porous insulation layer, preferably sandwiched between non-porous upper and lower insulation layers. The porous insulation layer is formed by depositing a composite layer comprising an insulation material or a material which can be converted to an insulation material, by a converting process and a material which can be converted to a gas upon subjection to the converting process. Release of the gas leaves behind a porous matrix of the insulation material which has a lower dielectric constant than the composite layer.

14 Claims, 2 Drawing Sheets

5,494,859

LOW DIELECTRIC CONSTANT INSULATION LAYER FOR INTEGRATED CIRCUIT STRUCTURE AND METHOD OF MAKING SAME

BACKGROUND OF THE INVENTION

1. Field of the Invention

This invention relates to integrated circuit structures. More particularly, this invention relates to one or more low dielectric constant insulation layers formed on an integrated circuit structure and a method of making same.

2. Description of the Related Art

In the formation of integrated circuit structures, patterned conductive layers are commonly used to provide electrical interconnection between various functional devices comprising the integrated circuit structure. A continuing desire to reduce the size of features in such integrated circuit structures includes reducing the horizontal spacing between adjacent conductors on the same plane. A reduction of feature size, however, often results in a corresponding rise in the capacitance of the conductors, as well as raising a problem of crosstalk between the conductors. An increase in capacitance of the lines in the integrated circuit structure can result in degradation of the performance of the integrated circuit structure by reducing the response time of the active devices, as well as by increasing the impedance of the lines.

It would, therefore, be desirable if one could reduce the amount of capacitance between adjacent lines, either horizontally or vertically, to thereby reduce the impedance of the lines. Theoretically, this could be done by substituting a different insulation material having a lower dielectric constant, for example, using some insulation material other than the commonly used $SiO_2$, or by somehow reducing the dielectric constant of the particular insulation material being used, for example, somehow reducing the dielectric constant of a $SiO_2$ insulation layer.

SUMMARY OF THE INVENTION

In accordance with the invention, a low dielectric constant insulation material is provided which includes a porous insulation layer, preferably sandwiched between nonporous upper and lower insulation layers. The presence of some gases such as for example air or an inert gas, or the presence of a vacuum, in the porous insulation material can reduce the overall dielectric constant of the insulation material, thereby effectively reducing the capacitance of the structure. The porous insulation layer can be provided by first forming a composite layer over the integrated circuit structure on a semiconductor wafer. The composite layer comprises a matrix forming material which is either itself an insulation material or can be converted into an insulation material by a conversion process and a material which, in the conversion process, is converted into a gas. The composite layer is subjected to the conversion process to produce a gas and a porous matrix forming an insulation material which has a lower dielectric constant than the composite material. In a preferred embodiment the composite layer is a polysilicon/carbon layer which can be converted to a porous $SiO_2$ layer by oxidation, the carbon being oxidized to gaseous $CO_2$, which may escape from the matrix.

DETAILED DESCRIPTION OF THE INVENTION

The invention includes a low dielectric constant insulation layer formed on an integrated circuit structure on a semiconductor wafer by deposition on to the wafer of a composite layer comprising a mixture of at least two materials, at least one of which comprises a material which can be converted to a gas, and at least one of which comprises a matrix forming material which either is itself an insulation material or can be converted to an insulation material by means of the conversion process by which the gas is produced. The conversion process results in the formation of a porous insulation layer, since the presence of a gas in the resulting porous insulation material reduces the overall dielectric constant thereof, effectively reducing the capacitance of the integrated circuit structure. In a preferred embodiment the composite layer comprises a mixture of polycrystalline silicon (polysilicon) and carbon.

Such a low dielectric constant insulation layer is useful when forming an insulation layer between two conductive layers such as, for example, between a conductive silicon layer (e.g., a doped polysilicon layer) and the first metallization layer; or between metallization layers (or metal lines on the same layer) to thereby lower the effective capacitance between the conductive layers separated by such a low dielectric constant insulation layer.

By use of the term "low dielectric constant", in describing herein the resulting porous insulation material, it is meant a dielectric constant of less than about 3.9, in contrast, for example, to a conventional $SiO_2$ insulation material having a dielectric constant of 3.9.

Figure 1:
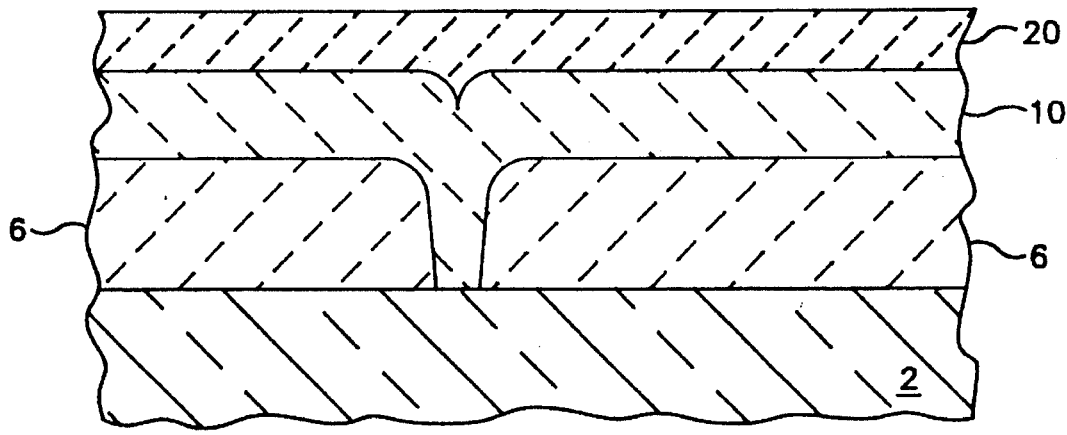
FIG. 1 is a fragmentary vertical cross-sectional view showing, in its simplest form, construction of a composite layer from which the low dielectric constant insulation layer of the invention will be formed.

Referring now to FIG. 1, the invention is shown in its simplest form, wherein a conductive polysilicon layer 10 is shown formed over oxide portions 6 and an integrated circuit structure, generally designated at 2. A composite layer of material 20, from which the low dielectric insulation layer of the invention will be formed, is shown deposited directly over polysilicon layer 10.

The low dielectric constant insulation layer of the invention is formed by first forming a composite layer, such as composite layer 20 shown in FIG. 1, comprising a mixture of two or more materials, at least one of which materials can be converted to a gaseous product, and at least one of which materials will remain after the conversion process as aporous matrix comprising the low dielectric constant insulation material. In its simplest form, a binary mixture may be used to form the composite layer, with one material (which may or may not be an insulative material) being subsequently removed from the composite layer in the form of a gas and one material remaining after the conversion process as an insulating material. It will be appreciated that it is within the scope of the invention to use two or more materials as the materials from which the gas is formed, or two or more materials as the matrix-forming materials which will remain as the low dielectric constant insulation material after the conversion, or any combination thereof, in the initial formation of the composite layer.

The material or materials used in the composite layer which will subsequently be removed as a gaseous product may comprise any material capable of being deposited in combination with the other material or materials to form the composite layer as a substantially homogeneous mixture and then be subsequently selectively removed from the composite layer as a gas while leaving the other material or materials as a porous matrix. Since the materials from which the gaseous product or products is formed will be substantially removed from the composite layer, it is not mandatory that it be an insulation material. However, it is preferable that insulation materials be used as the material which results in the formation of a gas since it is possible that all of this material may not be removed, either by choice or based on the economics of achieving full removal. Preferably the gas forming material or materials will be easily removed selectively from the remaining insulation material without any deleterious effects noted either on the remaining insulation material or any other exposed portions of the integrated circuit structure.

An example of a material which forms a gaseous product and which may be used to form the composite layer comprises carbon, that upon conversion by oxidation, forms $CO_2$ gas. Other materials which may be used as the gas producing member of the composite layer may include, for example, germanium, which upon conversion by treatment with ammonia forms germanium nitride, $Ge_3N_2$, or possibly $Ge_3N_4$... $Ge_3N_2$ sublimes at a temperature of about 650° C.

The matrix forming material used in the composite layer will, in its simplest form, typically include a form of silicon, e.g. polysilicon, which forms an insulating oxide upon oxidation. However, the use of other materials, either in place of, or in a mixture with polysilicon should be deemed to be within the scope of the invention. Other materials which could be used, either separately or in combination with polysilicon, i.e., the material which will comprise the low dielectric constant insulation layer after removal of the material which is convertible to a gaseous product, includes, for example, amorphous silicon as well as other forms of silicon and compounds thereof.

The ratio of matrix-forming material to material which is removed by conversion to a gas in the resulting composite layer may range from as little as 10 wt % matrix-forming material up to as high as 90 wt % or even higher if so desired. Preferably, the matrix-forming material will comprise about 40–60 wt % of the mixture. A higher minimum amount, depending upon the desired structural integrity or strength of the matrix of porous material remaining after the conversion step, may sometimes be desired.

It should also be noted that the ratio of matrix-forming material to removable material will affect the amount or degree of to which the dielectric constant of the remaining porous matrix is lowered. Therefore, the minimum amount of matrix-forming material used in the formation of the composite layer will usually be dependent upon the desired (and necessary) minimum strength of the resulting porous matrix left after removal of the material which is converted into a gas, while the maximum amount of matrix-forming material used in the mixture to form the composite layer will be dependent upon the desired lowering of the dielectric constant of the final porous low dielectric constant insulation layer of the invention. Since both minimum mechanical strength and dielectric constant change will be dependent upon the type of material used as the matrix-forming material, and since neither parameter will necessarily vary linearly with concentration, determination of the exact ratio of matrix-forming material to removable material to be used for a given composite layer will be determined empirically for each particular case.

In the formation of the composite layer, one or more dopants may also be added, for example, to permit the resulting composite layer to flow at a lower temperature, either during the deposition or upon subsequent heating, for planarization purposes. From 0 to 5 wt % (based on the weight of the matrix-forming portion of the composite mixture) of either boron, phosphorus, or arsenic dopants, or mixtures of same, may be used, with the total weight of the dopants in the resulting composite layer not exceeding about 10 wt % of the matrix-forming materials in the composite layer.

The thickness of the composite layer will vary depending upon the desired application and the structural integrity of the insulation material which remains after the conversion. Typically, the thickness of the composite layer may range from as low as about 200 Angstroms to as much as about 20,000 Angstroms, or even thicker in particular instances. Particularly preferred are thicknesses of about 5,000 to 7,000 Angstroms.

Since the resulting low dielectric constant layer, after the conversion, will be a porous layer, impurities (including dopants) trapped within the porous layer, or included in the material which forms the matrix, may gradually move to the surface of the low dielectric constant layer. This migration of dopants to the surface of the layer could possibly cause reliability problems in the resulting integrated circuit. Therefore, in a preferred embodiment of the invention, the low dielectric constant insulation layer is formed with one or more lower and upper solid encapsulation layers of insulation materials which will prevent or inhibit such impurity migration. Such solid encapsulation layers may, for example, simply comprise conventionally deposited $SiO_2$ layers or dual layers of $SiO_2$ and $Si_3N_4$, as will be further described below. Such optional encapsulation layers may range in thickness, for example, from as little as 100 Angstroms to as much as 1000 Angstroms or even higher, if necessary or desired.

Figure 2:
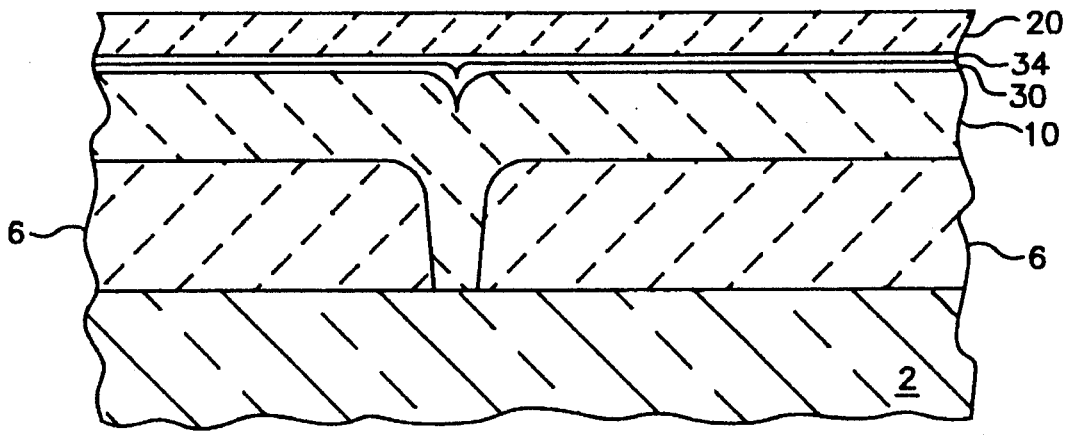
FIG. 2 is a fragmentary vertical cross-sectional view showing construction of the composite layer over a dual layer of non-porous insulation material which prevents materials (such as dopants in the low dielectric constant insulation t0 layer to be formed from the composite layer) from migrating downwardly into portions of the integrated circuit structure below.
Figure 3:
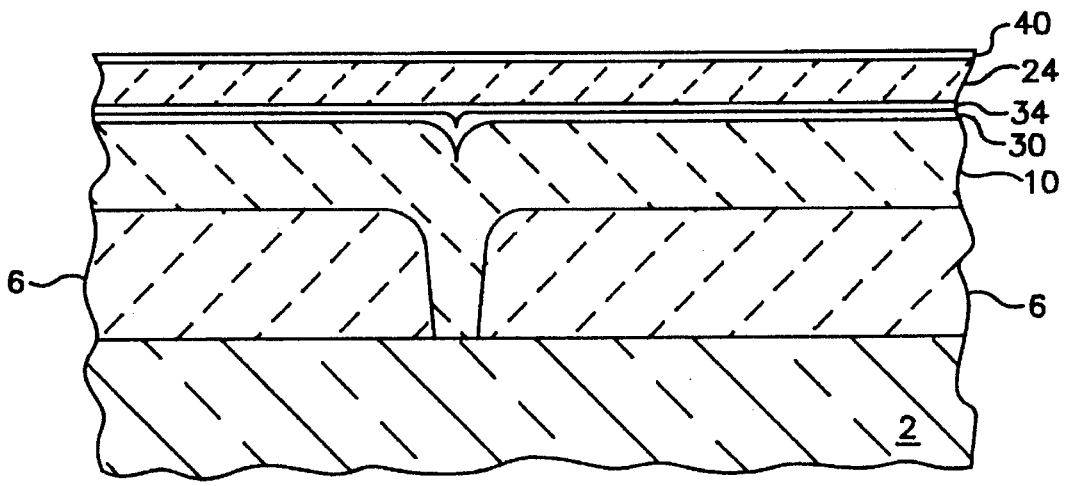
FIG. 3 is a fragmentary vertical cross-sectional view of the structure of FIG. 2 after formation of a single encapsulation layer over the low dielectric constant insulation layer to prevent upward migration of such impurities.

The use of such solid encapsulation or capping layers is illustrated in FIG. 2 wherein a first solid insulation layer 30 of silicon oxide is illustrated as formed over conductive polysilicon layer 10 of FIG. 1. A second solid insulation layer 34, which may comprise silicon nitride, is shown formed over insulation layer 30. Together, insulation layers 30 and 34 comprise a dual encapsulation or capping layer which serves to seal the underlying portions of integrated circuit structure 2 and polysilicon layer 10 from composite layer 20 which is shown formed over layer 34. As shown in FIG. 3, an upper capping or sealing layer 40, which may also comprise $SiO_2$, can then be formed over the structure after the material which forms a gas as a conversion product has been removed to form low dielectric constant porous insulation layer 24 of the invention (formerly composite layer 20 of FIG. 2), as will now be described. While the lower encapsulation or capping layer has been shown formed from two layers of material (layers 30 and 34) and upper capping layer 40 is shown as a single layer, it will be understood that this is only for illustrative purposes and either the lower or upper encapsulation layer may comprise either a single layer or a dual layer as desired.

By way of illustration, and not of limitation, the formation of the composite layer will be hereinafter described with respect to the formation of a composite comprising a mixture of polycrystalline silicon (polysilicon) and carbon.

The mixture of polysilicon and carbon may be deposited over the underlying surface on the integrated circuit structure by sputtering or, preferably, by a chemical vapor deposition (CVD) process, for example, by flowing a mixture of silane and acetylene (and optionally one or more dopant gases) into a chamber maintained at atmospheric pressure or under vacuum, for example, as low as a few Torr, while a wafer temperature of from anywhere between about 20° C. to about 500° C., and preferably from about 300° C. to about 450° C., is maintained. The flow rates of the respective gases into the vacuum chamber depends upon the size of the chamber and the desired deposition rate, while the ratio of the gases to one another will be dependent upon the desired ratio in the composite layer being deposited. The deposition time will be dependent upon the desired thickness of the composite layer.

Other deposition processes can be used such as, for example, a low pressure chemical vapor deposition (LPCVD) or a plasma-enhanced chemical vapor deposition (PECVD) process.

After formation of composite layer 20, the integrated circuit structure may be heated, if desired, to cause layer 20 to flow for planarization purposes. When no metallization is already present on the integrated circuit structure, nor any prior porous insulation layers already formed, the structure may be heated to a temperature of typically from anywhere between about 200° C. up to about 1100° C., and preferably from about 400° C. to about 800° C. If a metallization layer (and/or a first porous insulation layer) has already been formed and the (second) low dielectric constant insulation layer of the invention is being formed between such a metal layer and a subsequent metal layer to be formed thereover, heating of the structure for planarization purposes will be governed by the melting point of the already deposited metal layer (as well as the effect of such a temperature on the previously formed porous layer). Where aluminum is employed in the formation of a prior metallization layer, for example, the structure should not be heated to a temperature of above about 500° C. If copper is employed in the formation of a prior metallization layer, for example, the temperature of the structure should not be raised above 1000° C. It should be recognized that such planarization may also be carried out by chemical or mechanical polishing or a combination thereof. This will be found to be particularly useful in those instances where heating the wafer to cause the composite layer to flow, for planarization purposes, would create problems elsewhere on the structure.

Composite layer 20 is converted to a porous matrix comprising low dielectric constant insulation layer 24 of the invention, as shown in FIG. 3, by treatment with a reagent such as oxygen, in the case of carbon conversion, or ammonia in the case of germanium conversion, to produce carbon dioxide or germanium nitride, respectively. Temperatures in the range of about 800°–1200° C. are suitable for the conversion process. The reaction time is dependent upon the thickness of the insulation layer desired. A porous matrix is formed upon the release of a gaseous conversion product, for example carbon dioxide or germanium nitride.

At this point, if desired, a capping layer 40 of non-porous insulation material may be formed over the porous low dielectric constant insulation layer 24, as shown in FIG. 3. Capping layer 40 is formed similarly to the encapsulation layer or layers (30 and 34) formed over the integrated circuit structure beneath porous low dielectric constant insulation layer 24. Such a capping layer may be conventionally formed using the same techniques previously described for forming the lower encapsulation layer. If the use of capping layer 40 is either not desired or needed, this step may, of course, be dispensed with.

Figure 4:
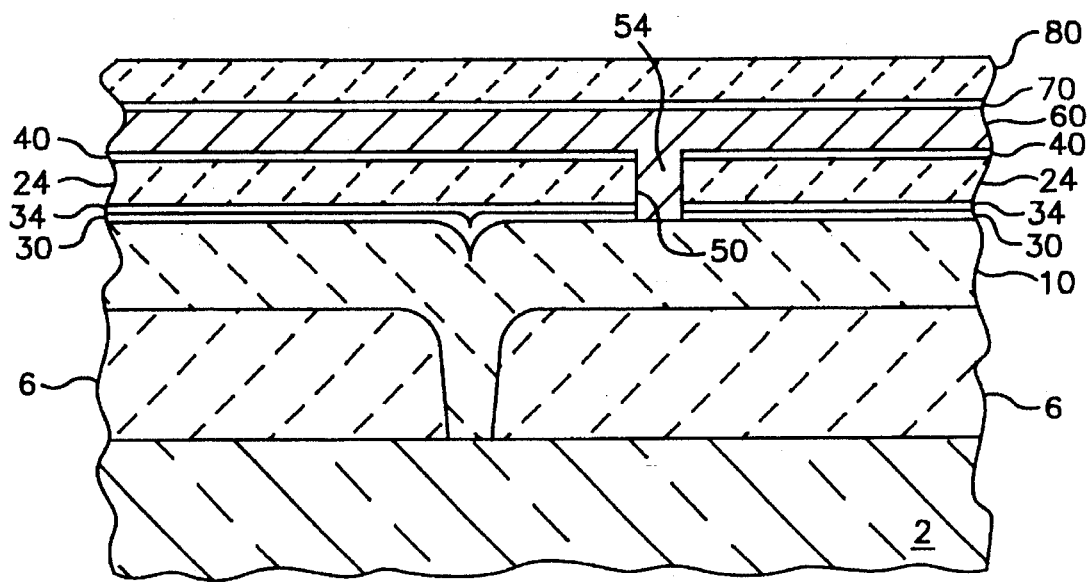
FIG. 4 is a fragmentary vertical cross-sectional view of the structure of FIG. 3 after formation of a contact opening in the first low dielectric constant insulation layer, a patterned first metallization layer formed over the insulation layer, a capping layer formed over the first metallization layer, and a second composite layer deposited in preparation for forming a second low dielectric constant insulation layer.

The resultant low dielectric constant insulation layer may now be conventionally processed, for example to form vias or contact openings 50, as shown in FIG. 4, followed by filling of contact opening with a conductive filler material 54, such as tungsten. A metallization layer 60 is then formed over low dielectric constant insulation layer 24 and capping layer 40 (if used). If capping layer 40 is used, the patterning to form the desired vias or contact openings 50 will be applied over the upper surface of layer 40.

It should be noted that if one or more dopant materials are used in the formation of the low dielectric constant insulation layer, care must be taken in material selection for the filler material to be used in the contact openings. This is because the capping or encapsulation layers placed above and below the low dielectric constant layer will not prevent leaching out or migration of the dopant where the low dielectric constant layer is exposed when the contact opening is cut through the insulation layer. Thus, for example, it may be preferable to use tungsten as a filler material for the contact opening.

Still referring to FIG. 4, the structure shown in FIG. 3 is now shown formed with a contact opening 50 filled with a conductive filler material 54 such as tungsten and a first metallization layer 60 formed over capping layer 40 on first low dielectric constant insulation layer 24. First metallization layer 60 is now patterned to form the desired interconnects.

A capping or encapsulation layer 70 may then be formed over first metallization layer 60 in preparation for forming a second low dielectric constant insulation layer over capping layer 70 and first metallization layer 60. This second low dielectric constant insulation layer may then be formed in the same manner as the formation of the first low dielectric constant insulation layer 24. That is, the second low dielectric constant insulation layer may be formed by first forming a second composite layer 80, which may be identical in composition to first composite layer 20, and then removing a gaseous conversion product from it using one of the techniques previously discussed. However, as also previously discussed, care must be exercised if it is desired to heat second composite layer 80 prior to the conversion step to planarize it since the use of excessive heat may damage either the first metallization layer 60 or the first low dielectric constant insulation layer 24.

Figure 5:
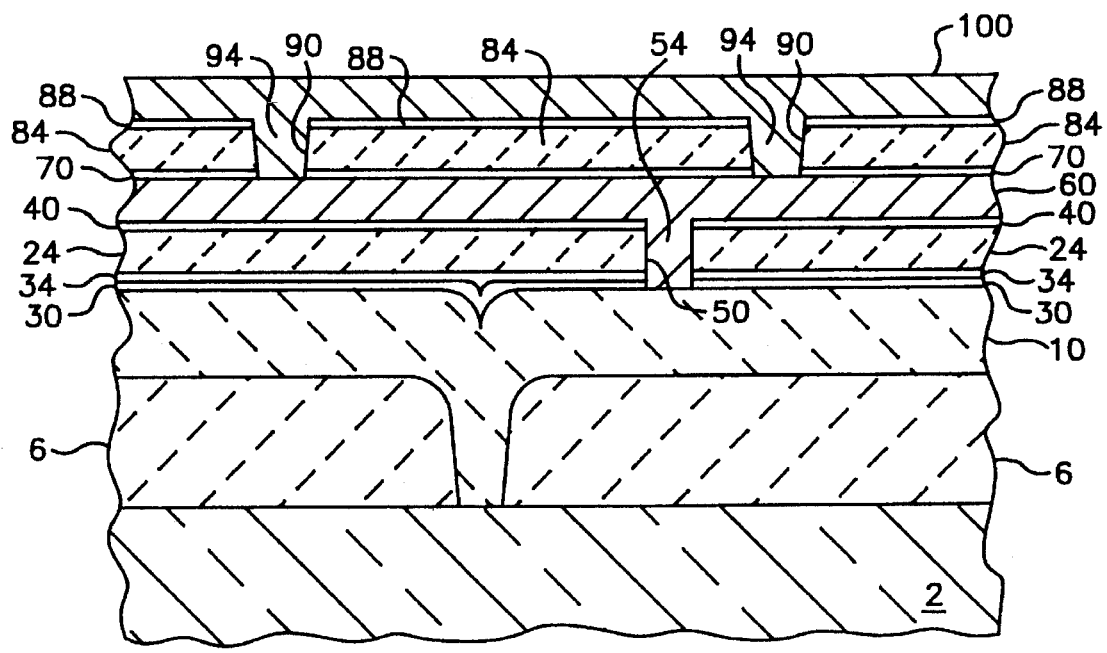
FIG. 5 is a fragmentary vertical cross-sectional view of the structure of FIG. 4 after formation of the second low dielectric constant insulation layer, formation of contact openings therein, and formation of a patterned second metallization layer over the second low dielectric constant insulation layer.

As shown in FIG. 5, after formation of a second low dielectric constant insulation layer 84 from second composite layer 80 shown in FIG. 4, a capping layer 88 may be optionally formed over second low dielectric constant insulation layer 84. Second low dielectric constant insulation layer 84, and capping layer 88 (if formed thereon) may then be patterned to form contact holes 90 to first metallization layer 60. The contact holes 90 may then be filled with conductive filler material 94 similarly to the filling of contact hole 50, and a second metallization layer 100 may then be deposited over the structure and patterned.

This process may then be optionally repeated as many times as needed or desired to form further low dielectric constant insulation layers, in accordance with the invention, for as many subsequent metallization layers as will be used in the integrated circuit structure.

The following example will serve to further illustrate the invention. A first sealing layer of non-porous $SiO_2$ may be first deposited by CVD processes over an integrated circuit structure on a semiconductor wafer to a thickness of about 0.1 μm. Then about 1 μm of a composite layer, comprising about 50 wt % polysilicon and 50 wt % carbon, is deposited by CVD over the newly deposited non-porous $SiO_2$ layer. The composite layer is then oxidized to convert the polysilicon to $SiO_2$ and the carbon to $CO_2$, to thereby provide a porous $SiO_2$ matrix. Oxidation is conducted at atmospheric pressure at a temperature within the range of about 800° C. to 850° C. After all of the $CO_2$ has been removed, leaving behind the solid porous matrix of $SiO_2$, a further non-porous sealing layer of $SiO_2$ may be deposited over the resulting porous low dielectric constant $SiO_2$ insulation layer to a thickness of about 0.1 μm.

Thus, as disclosed above, the present invention comprises a low dielectric constant insulation layer and a method of making same wherein an insulation layer is first formed as a composite layer which includes one or more materials which can be converted to gaseous products and, when removed, leave behind a porous matrix of the insulation material. Due to the porous nature of the resulting matrix, a lower dielectric constant, is achieved in this matrix layer providing a lowering of the capacitance within an integrated circuit structure formed with such a low dielectric constant insulation layer or layers.

It should be understood by those skilled in the art that various modifications and adaptations could be made to the examples and preferred embodiments discussed above without departing from the scope of the present invention. Accordingly, the invention is not to be limited to the examples and embodiments disclosed above, but only by the claims set forth below and equivalents thereof. Having thus described the invention what is claimed is:

I claim:

1. A process for forming a low dielectric constant insulation layer on an integrated circuit structure on a semiconductor wafer which comprises:
   a) forming a composite layer comprising one or more materials which are convertible to a gas and one or more materials which either are themselves insulation materials or are convertible to insulation materials; and
   b) converting said composite layer to a porous low dielectric constant insulation layer, wherein:
   said step of forming said composite layer on said semiconductor wafer further comprises depositing said composite layer on said wafer by a chemical vapor deposition process;
   said step of forming said composite layer further comprises depositing on said semiconductor wafer a mixture comprising:
   a) polycrystalline silicon, comprising the material which is convertible to an insulation material; and
   b) carbon, comprising the material which is convertible to a gas; and
   said step of converting said composite layer comprises simultaneously oxidizing said polycrystalline silicon to form silicon dioxide and oxidizing said carbon to produce gaseous carbon dioxide.

2. The process of claim 1 wherein one or more materials which either are themselves insulation materials or are convertible to insulation materials comprise about 10 wt % to about 90 wt % of said composite layer prior to said converting step.

3. The process of claim 1 wherein said step of forming said composite layer further comprises forming said composite layer with one or more optional dopants present.

4. The process of claim 1 including the further step of heating said composite layer to planarize said layer prior to said converting step.

5. The process of claim 1 including the further steps of:
   a) forming one or more lower non-porous insulation layers on said integrated circuit structure prior to said step of forming said composite layer, to thereby prevent downward migration of impurities from said porous structure into said integrated circuit structure; and
   b) forming one or more upper non-porous insulation layers over said low dielectric constant insulation layer after said converting step to thereby prevent upward migration of impurities from said porous structure into said integrated circuit structure.

6. The process of claim 1 wherein said step of forming said composite layer on said semiconductor wafer by a chemical vapor deposition process further comprises depositing said composite layer while maintaining a plasma during said chemical vapor deposition process.

7. The process of claim 5 including the further steps of:
   a) forming one or more contact openings in said one or more lower non-porous insulation layers, said low dielectric constant insulation layer, and said one or more upper non-porous insulation layers;
   b) filling said contact openings with conductive material; and
   c) forming a patterned metal layer over an upper surface of said one or more upper non-porous insulation layers.

8. A process for forming a low dielectric constant insulation layer on an integrated circuit structure on a semiconductor wafer which comprises:
   a) forming a composite layer comprising one or more materials which are convertible to a gas and one or more materials which either are themselves insulation materials or are convertible to insulation materials; and
   b) converting said composite layer to a porous low dielectric constant insulation layer, wherein:
   said step of forming said composite layer on said semiconductor wafer further comprises depositing said composite layer on said wafer by a chemical vapor deposition process;
   said step of forming said composite layer further comprises depositing on said semiconductor wafer a mixture comprising:
   a) polycrystalline silicon, comprising the material which is convertible to an insulation material; and
   b) germanium, comprising the material which is convertible to a gas; and
   said step of converting said composite layer comprises simultaneously oxidizing said polycrystalline silicon to form silicon dioxide and oxidizing said carbon to produce gaseous germanium nitride.

9. The process of claim 8 wherein one or more materials which either are themselves insulation materials or are convertible to insulation materials comprise about 10 wt % to about 90 wt % of said composite layer prior to said converting step.

10. The process of claim 8 wherein said step of forming said composite layer further comprises forming said composite layer with one or more optional dopants present.

11. The process of claim 8 including the further step of heating said composite layer to planarize said layer prior to said converting step.

12. The process of claim 8 including the further steps of:
    a) forming one or more lower non-porous insulation layers on said integrated circuit structure prior to said step of forming said composite layer, to thereby present downward migration of impurities from said porous structure into said integrated circuit structure; and
    b) forming one or more upper non-porous insulation layers over said low dielectric constant insulation layer after said converting step to thereby prevent upward migration of impurities from said porous structure into said integrated circuit structure.

13. The process of claim 8 wherein said step of forming said composite layer on said semiconductor wafer by a chemical deposition process further comprises depositing said composite layer while maintaining a plasma during said chemical vapor deposition process.

14. The process of claim 12 including the further steps of:
    a) forming one or more contact openings in said one or more lower non-porous insulation layers, said low dielectric constant insulation layer, and said one or more upper non-porous insulation layers;
    b) filling said contact openings with conductive material; and
    c) forming a patterned metal layer over an upper surface of said one or more upper non-porous insulation layers.

* * * * *